United States Patent
Jan et al.

(10) Patent No.: US 9,496,444 B2
(45) Date of Patent: Nov. 15, 2016

(54) METHOD FOR FORMING DENDRITIC SILVER WITH PERIODIC STRUCTURE AS LIGHT-TRAPPING LAYER

(71) Applicant: Institute of Nuclear Energy Research Atomic Energy Council, Executive Yuan, Taoyuan (TW)

(72) Inventors: Der-Jun Jan, Taoyuan County (TW); Shih-Shou Lo, Hsinchu County (TW); Wei-Hsun Lai, Taoyuan (TW); Wei-Hsiu Hsu, Taoyuan (TW)

(73) Assignee: INSTITUTE OF NUCLEAR ENERGY RESEARCH ATOMIC ENERGY COUNCIL, EXECUTIVE YUAN, Taoyuan (TW)

( * ) Notice: Subject to any disclaimer, the term of this patent is extended or adjusted under 35 U.S.C. 154(b) by 0 days.

(21) Appl. No.: 14/612,948

(22) Filed: Feb. 3, 2015

(65) Prior Publication Data
US 2016/0099364 A1    Apr. 7, 2016

(30) Foreign Application Priority Data

Oct. 7, 2014 (TW) .............................. 103134916 A

(51) Int. Cl.
| | |
|---|---|
| H01L 21/00 | (2006.01) |
| H01L 31/056 | (2014.01) |
| H01L 31/20 | (2006.01) |
| H01L 31/18 | (2006.01) |

(52) U.S. Cl.
CPC ......... *H01L 31/056* (2014.12); *H01L 31/1884* (2013.01); *H01L 31/202* (2013.01)

(58) Field of Classification Search
CPC   H01L 31/056; H01L 31/202; H01L 31/1884
See application file for complete search history.

(56) References Cited

U.S. PATENT DOCUMENTS

| | | | |
|---|---|---|---|
| 2005/0150776 A1* | 7/2005 | Murakami | B23H 3/00 205/652 |
| 2009/0229854 A1* | 9/2009 | Fredenberg | B81C 99/0085 174/126.1 |
| 2010/0259826 A1* | 10/2010 | Ji | B82Y 20/00 359/599 |
| 2011/0240476 A1* | 10/2011 | Wang | B82Y 20/00 205/67 |
| 2011/0248265 A1* | 10/2011 | Forbes | H01L 31/02363 257/51 |
| 2013/0017498 A1* | 1/2013 | Mao | G03F 7/70408 430/322 |
| 2013/0260113 A1* | 10/2013 | Hart | B32B 3/22 428/201 |
| 2014/0048420 A1* | 2/2014 | Chen | C25D 5/54 205/157 |
| 2015/0104936 A1* | 4/2015 | Markovich | H01L 31/02246 438/610 |

(Continued)

OTHER PUBLICATIONS

Harry A. Atwater et al., "Plasmonics for improved photovoltaic devices", Feb. 19, 2010.

(Continued)

*Primary Examiner* — Dale E Page
*Assistant Examiner* — Wasiul Haider
(74) *Attorney, Agent, or Firm* — WPAT, PC; Justin King

(57) ABSTRACT

The invention is related to a method for forming dendritic silver with periodic structure as light-trapping layer, includes these steps: form a photoresist layer on a conductive substrate, and at least two coherent light beams is provided in using a laser interference lithography apparatus, to form a plurality of particular patterns respectively on the setting-exposure positions of the conductive substrate in sequence till the particular periods pattern formed. Thereafter, form the dendritic silver nanostructure with period pattern on the conductive substrate via electrochemical process, wherein operating voltage is 2V or higher, and electrochemical reaction time is 10 sec or higher.

13 Claims, 7 Drawing Sheets

(56) References Cited

U.S. PATENT DOCUMENTS

| | | | |
|---|---|---|---|
| 2015/0234286 A1* | 8/2015 | Son | G03F 7/70375 430/325 |
| 2015/0371810 A1* | 12/2015 | Guerrera | H01J 37/065 250/396 R |
| 2016/0027932 A1* | 1/2016 | Lu | H01L 31/0201 136/244 |

OTHER PUBLICATIONS

Zi Ouyang et al., "Effective light trapping in polycrystalline silicon thin-film solar cells by means of rear localized surface plasmons", Jul. 1, 2010.

Carsten Rockstuhl et al., "Absorption enhancement in solar cells by localized plasmon polaritons", Dec. 17, 2008.

* cited by examiner

| Sample | Voc(V) | Jsc(mA/cm$^2$) | FF(%) | η (%) |
|---|---|---|---|---|
| Sample H | 8.77 | 7.2 | 50 | 3.55 |
| Sample G | 8.96 | 8.0 | 55 | 3.91 |
| Sample F | 8.95 | 6.9 | 48 | 3.26 |

| S1/S2 | coating a photoresist layer on a side surface of a conductive substrate while enabling the conductive substrate to rotate or move to a specific position |

| S3 | using an interference lithography device to provide and project at least two coherent beams of specific shapes and uniform intensity onto the conductive substrate for forming an exposure area of a specific interference pattern thereon |

| S4 | adjusting and moving the at least two coherent beams to project upon another exposure area of the conductive substrate |

| S5/S6 | repeating steps (S3) to (S4) for a plurality of times for forming a plurality of exposure areas of the specific interference pattern that are interconnected to one another into a pattern of a specific pitch period; and then performing an exposure lithography process |

| S7 | placing the conductive substrate and a conductor separately inside a container containing an electrolyte which at least contains silver nitride, citric acid and a deionized water, and the proportion of the silver nitride and the citric acid in the electrolyte is defined by a mole ratio selected from the group consisting of: 0.8~0.9 : 1, 0.9~1 : 1, 0.9~1: 1, 1~1.1 : 1, and 1.1~1.2 : 1 |

| S8 | providing a direct-current source for enabaling an electrochemical reaction under room temperature, in which the operating voltage of the direct-current source for enabling the electrochemical reaction is at least 2V, while the reaction time of the electrochemical reaction is lasting for at least 10 seconds, and thereby, a layer of dendritic silver nanostructure with period patterns is formed on the conductive substrate |

FIG. 7

METHOD FOR FORMING DENDRITIC SILVER WITH PERIODIC STRUCTURE AS LIGHT-TRAPPING LAYER

FIELD OF THE INVENTION

The present invention relates to a method for forming dendritic silver with periodic structure as light-trapping layer, and more particularly, to a method for forming dendritic silver with surface plasmonic periodic nanostructure on a back reflection layer of a thin film solar cell by the use of a laser interference lithography process that can be applied in all kinds of large-size thin film solar cells.

BACKGROUND OF THE INVENTION

With the fossil fuel is drying up after being exploited for several decades and also considering the strategy of sustainability and environmental protection, there are more and more researches focusing on the development of solar energy. However, since the high-efficiency silicon wafers that are available today are still can not provide satisfactory electrical performance and are very expensive, the levelized cost of electricity for any solar electric generating system is higher than other power generating sources, such as thermal power plants or nuclear power stations. Thus, despite of its promising future, the use of solar cells is still limited. Responsively, in order to reduce the power generating cost, the technology of thin-film solar cell (TFSC) is getting more and more attention since the thin-film solar cells can be made by materials that are significantly cheaper, and the development in thin-film solar cell technology is focusing most on how to effectively reduce the cost of the light absorption layer in solar cells while maintaining a high power conversion efficiency. For effectively enhancing the conversion quantum efficiency inside solar cells and the solar absorptivity, a variety of structures, including light-trapping structures and grating structures, had been developed to be built inside thin-film solar cells, and consequently by the light scattering enabled by those light-trapping structures, light entering a thin-film solar cell can be reflected and refracted multiple times between solar panels inside the thin-film solar cell while allowing the same to be absorbed by the absorption layers, and thus enabling the solar photovoltaic conversion efficiency to be enhanced.

Recently, a number of researchers had been focusing their studies to the integration of silver nanostructures into solar cells for experimenting an innovated light trapping method in thin film solar cell by the use of metallic nanostructures that supports surface plasmon resonance (SPR). SPRs, especially localized SPRs, are collective electron charge oscillations in metallic nanoparticles that are excited by light. It is noted that nanoparticles of noble metals exhibit strong absorption bands in the specific regime of solar spectrum, and this extraordinary absorption increase has been exploited to increase light absorption in photovoltaic cells by depositing metal nanoparticles on the cell surface. Since the excitation of plasmon resonances can capture and trap the sunlight into the active layer and increase absorption strength, many light trapping techniques of different silver nanostructure have been investigated in thin film solar cell applications for increasing light absorption, and thus increasing photoelectric conversion efficiency.

More recently, there are many metallic nanostructures engineered within the solar cell geometry for confining and folding light into the ultrathin active layer, and thereby increasing light absorption. For example, a kind of novel thin film solar cell design of introducing nano-gratings onto metallic back contact of thin film solar cells has been investigated widely since experimentally it can enhance the desired light confining effect by five times. Nevertheless, such nano-gratings are difficult to manufacture, especially in large area. Other than that, there are other ideas of light confining structure being proposed for increasing conversion efficiency of thin film solar cells, and most of those light confining structures are made of dielectric materials. However, while intending to made such light confining structures using other materials, such as precious metals, the situation is completely different both in design and manufacturing points of view.

There are already many researches relating to the use of metallic nanostructures in thin film solar cells. One of which is a paper disclosed in 2008, entitled "Absorption enhancement in solar cells by localized Plasmon polaritons", by Dr. Carsten et al., in which an investigation is provided to enhance the absorption in solar cells by employing localized plasmon polaritons excited in silver nanowires, whereas the solar cells are assumed to be made of amorphous silicon. In another paper disclosed in 2010, entitled "Effective light trapping in polycrystalline silicon thin-film solar cells by means of rearlocalized surface plasmons", by Quyany et al., in which significant short-circuit current enhancement of 29% has been achieved for evaporated solid-phase-crystallized polycrystalline siliconthin-filmsolar cells on glass, due to light trapping provided by Agnanoparticles located on the rear siliconsurface of the cells.

Moreover, there is further a paper disclosed in Nature Materials at 2010, entitled "Plasmonics for improved photovoltaic devices", in which recent advances at the intersection of plasmonics and photovoltaics are surveyed and an outlook on the future of solar cells based on these principles is offered. Notably, although design approaches based on plasmonics can be used to improve absorption in photovoltaic devices, permitting a considerable reduction in the physical thickness of solar cells in small size, their usability in large-size solar cells is still questionable as well as its commercialization possibility in the future.

SUMMARY OF THE INVENTION

In view of the disadvantages of prior art, the primary object of the present invention is to provide a method for forming dendritic silver with periodic structure as light-trapping layer, which includes the steps of:
(a) forming a photoresist layer on a side surface of a conductive substrate by a means selected from the group consisting of: a means of spin coating and a means of slit coating;
(b) using an interference lithography device to provide and project two coherent beams of specific shapes onto the conductive substrate for forming an exposure area of a specific interference pattern thereon;
(c) adjusting and moving the two coherent beams to project upon another exposure area of the conductive substrate;
(d) repeating steps (b) to (c) for a plurality of times for forming a plurality of exposure areas of the specific interference pattern that are interconnected to one another into a pattern of a specific pitch period;
(e) performing an exposure lithography process;
(f) placing the conductive substrate and a conductor separately inside a container containing an electrolyte while connecting the conductive substrate and the conductor respectively to a cathode and an anode of a direct-current source for enabling an electrochemical reaction; and (g) performing an etching process upon the conductive substrate for forming dendritic silver nanostructure with periodic patterns to be used as a light trapping layer.

In an embodiment of the present invention, the specific interference pattern is a one-dimensional interference pattern; and the operating voltage of the direct-current source for enabling the electrochemical reaction is at least 2V, while the reaction time of the electrochemical reaction is lasting for at least 10 seconds.

In another embodiment of the present invention, the exposure lithography process is enabled by an interference lithography device of Mach-Zehnder architecture; and the two coherent beams of specific shapes are coherent beams of uniform intensity, while enabling the two coherent beams to be projected in directions allowing a specific included angle sandwiched therebetween, and consequently, the step (b) can further include a step of: rotating or moving the conductive substrate and correspondingly adjusting the specific included angle for forming a two dimensional interference pattern in the exposure area.

By the aforesaid method for forming dendritic silver with periodic structure as light-trapping layer, the light-trapping layer is used as a back reflector of a solar cell and it is formed by the use of a laser interference lithography (LIL) process and an electrochemical process for enabling different dendritic silver nanostructures with different periodic patterns to be formed on a conductive layer of the solar cell while having a layer of Al-doped ZnO (AZO) of specific thickness to be covered thereon, and consequently the short-circuit current density is enhanced by 14% and the conversion efficiency is increased by 20%. Therefore, the method of the invention is suitable for manufacturing large-area thin film solar cells.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 7 is a flow chart depicting steps perform in a method for forming dendritic silver with periodic structure as light-trapping layer according to the present invention.

DESCRIPTION OF THE EXEMPLARY EMBODIMENTS

Figure 1A:
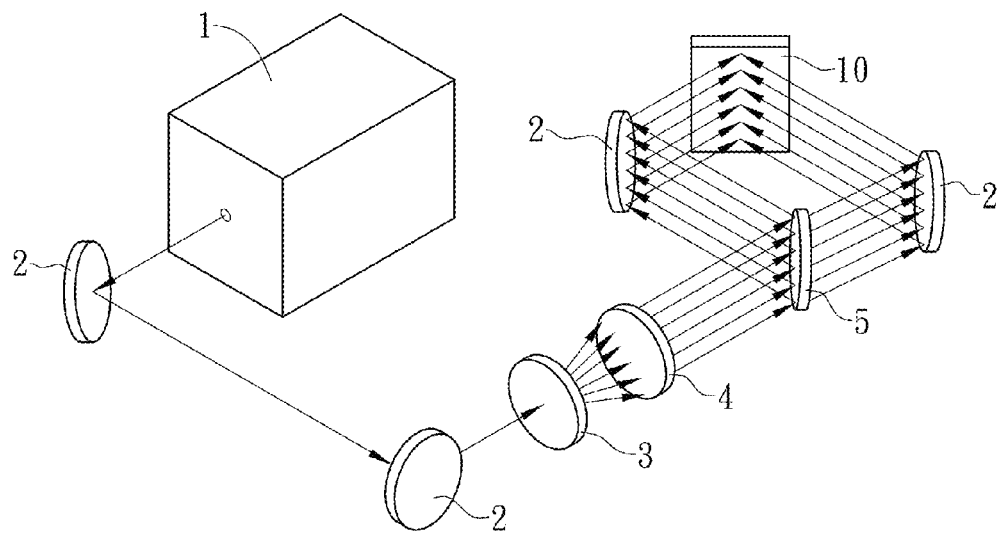
FIG. 1A is a schematic diagram showing an interference lithography device of Mach-Zehnder architecture used in the present invention.

For your esteemed members of reviewing committee to further understand and recognize the fulfilled functions and structural characteristics of the invention, several exemplary embodiments cooperating with detailed description are presented as the follows.

Since the excitation of plasmon resonances can capture and trap the sunlight into the active layer and increase absorption strength, many light trapping techniques of different silver nanostructure have been investigated in thin film solar cell applications for increasing light absorption, and thus increasing photoelectric conversion efficiency. By the method of the present invention for forming dendritic silver with periodic structure as light-trapping layer that is to be used as a back reflector of a solar cell, whereas it is formed by the use of a laser interference lithography (LIL) process and an electrochemical process for enabling different dendritic silver nanostructures with different periodic patterns to be formed on a conductive layer of the solar cell while having a layer of Al-doped ZnO (AZO) of specific thickness to be covered thereon, and consequently the short-circuit current density is enhanced by 14% and the conversion efficiency is increased by 20%. Therefore, the method of the invention is suitable for manufacturing large-area thin film solar cells.

Please refer to FIG. 7, which is a flow chart depicting steps perform in a method for forming dendritic silver with periodic structure as light-trapping layer according to the present invention. As shown in FIG. 7, the method comprises the steps of:

S1 coating a photoresist layer on a side surface of a conductive substrate 10 by a means selected from the group consisting of: a means of spin coating and a means of slit coating;

S2 enabling the conductive substrate 10 to rotate or move to a specific position;

S3 using an interference lithography device 100 to provide and project at least two coherent beams L of specific shapes and uniform intensity onto the conductive substrate 10 while allowing a specific included angle θ to be formed between the at least two coherent beams L for forming an exposure area of a specific interference pattern thereon;

S4 adjusting and moving the at least two coherent beams to project upon another exposure area of the conductive substrate, whereas there is no restriction relating to the selection of another exposure area only if it is selected according to requirements of the specific interference pattern;

S5 repeating steps (S3) to (S4) for a plurality of times for forming a plurality of exposure areas of the specific interference pattern that are interconnected to one another into a pattern of a specific pitch period;

S6 performing an exposure lithography process on the conductive substrate 10;

S7 placing the conductive substrate 10 and a conductor 20 separately inside a container containing an electrolyte 30 which at least contains silver nitride, citric acid and a solvent, while connecting the conductive substrate 10 and the conductor 20 respectively to a cathode 42 and an anode 41 of a direct-current source 40 for enabling an electrochemical reaction; and S8 enabling an electrochemical reaction under room temperature, in which the operating voltage of the direct-current source for enabling the electrochemical reaction is at least 2V, while the reaction time of the electrochemical reaction is lasting for at least 10 seconds, and thereafter, performing an etching process upon the conductive substrate 10 for removing any residue photoresist layer and thus forming a light trapping layer of dendritic silver nanostructure with period patterns.

By the aforesaid steps of the method disclosed in the present invention, the so-formed light trapping layer of dendritic silver nanostructure with period patterns can be used as a back reflector of a thin-film solar cell. However, in another embodiment, the method of the present invention further comprises the following step:

S9 performing a deposition process upon the conductive substrate for forming sequentially at least an a-Si photoelectric conversion layer containing at least one p-i-n semiconductor structure, a transparent conducting layer and an electrode layer on the light trapping layer so as to form a thin-film solar cell of dendritic silver nanostructure with periods pattern.

In an embodiment of the present invention, the conductive substrate is a substrate selected from the group consisting of: an ITO glass substrate, a silver-containing substrate and a stainless steel substrate; the transparent conducting layer is made of a material selected from the group consisting of: AZO, ITO, and IGTO; the conductor is a bar or a panel that is made of platinum; the solvent is selected from the group consisting of: a deionized water and a distilled water; the proportion of the silver nitride and the citric acid is defined by a mole ratio selected from the group consisting of: 0.8~0.9:1, 0.9~1:1, 0.9~1:1, 1~1.1:1, and 1.1~1.2:1; and the deposition process is a process selected from the group consisting of: a PVD process, a CVD process and the combination of the two.

Interference is an optical effect which can occur when two or more light beams are superimposed. In this case, the resulting total light field does not have an optical intensity which equals the sum of the intensities of the superimposed beams. Instead, its complex amplitude is the sum of the amplitudes of the superimposed beams. For example, the amplitudes of two equally intense light beams can have opposite signs at some location, so that they can cancel each other. On the other hand, with equal signs of both contributions, the total intensity can be four times that of the single beams. For example, if two light beams of equal intensity, frequency and polarization are superimposed on a screen with some angle between the beams, an interference pattern occurs which consists of bright and dark stripes. For its unique properties, namely, high monochromaticity, coherence and directionality, laser beam is generally suitable to be used as an interference light source.

Figure 1B:
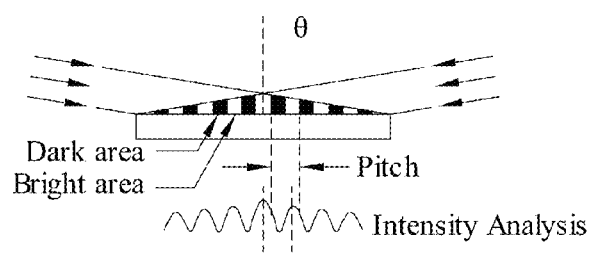
FIG. 1B is a schematic diagram showing an exemplary interfere pattern formed in the present invention.

Please refer to FIG. 1A and FIG. 1B, which are respectively a schematic diagram showing an interference lithography device of Mach-Zehnder architecture used in the present invention, and a schematic diagram showing an exemplary interfere pattern formed in the present invention. In FIG. 1A and FIG. 1B, by the reflection of a plurality of reflection mirrors 2, the propagation direction of a laser beam emitted from a laser source 1 in an interference lithography device 100 is changed and redirected for directing the same to travel toward a lens 4 via a spatial filter 3, so that the noise of the laser beam can be removed. Thereafter, the laser beam is directed toward a beam splitter 5 where it is split into two beams of the same intensity, and then the two beams are projected onto a conductive substrate 10 by the reflection of another two reflection mirrors 2. It is noted that the interference angle (2 θ) of the two beams can be precisely controlled by adjusting the optical path difference and the intensity of the two beams, and consequently, there can be various one-dimensional or two-dimensional interference patterns of different pitch periods being formed by the rotation of the conductive substrate. In addition, the pitch period of the Mach-Zehnder architecture used in the present invention is defined by the following formula:

$$d = \lambda/2 \sin(\theta/2)$$

wherein, d represents the pitch period,
θ represents an included angle formed between the two beams,
λ represents the wavelength of the laser beam.

Figure 2:
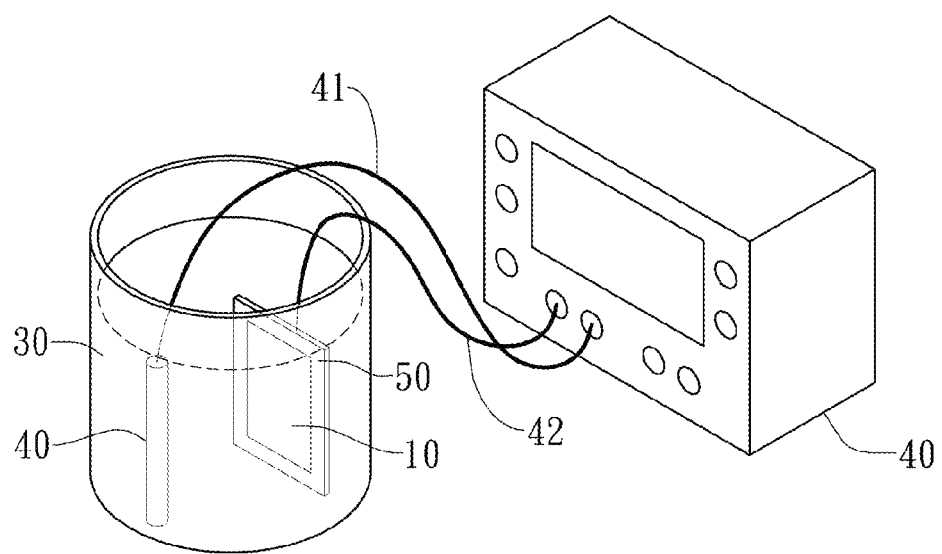
FIG. 2 is a schematic diagram showing an electrochemical device for forming silver nanostructure that is used in the present invention.

Please refer to FIG. 2, which is a schematic diagram showing an electrochemical device for forming silver nanostructure that is used in the present invention. Despite that nanostructures can be rapidly fabricated by the used of an electrochemical process, such nanostructures are generally not uniformly distributed since the moving directions of metal ions in an electrolyte can easily changed by the influence of electric field. Therefore, in order to obtain a silver nanostructure that is uniformed distributed on the conductive substrate by an electrochemical process of uniform electric filed, a conductive tape 50 is used in a manner that it is attached to the periphery of the conductive substrate 10 for forming a frame-like structure around the conductive substrate 10 as the conductive substrate 10 is connected to a cathode 42. In an embodiment, the conductive tape 50 can be a copper-containing tape, but is not limited thereby.

Figure 3A:
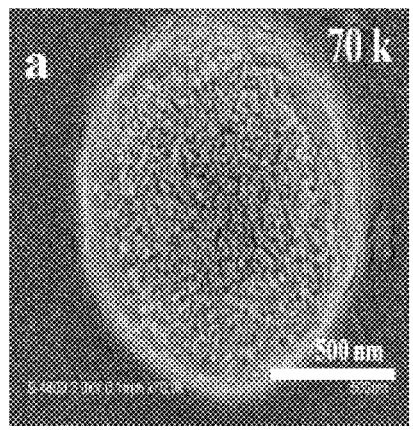
FIG. 3A and FIG. 3B are an SEM side view and an SEM front view of a silver nanostructure that is being formed by an electrochemical process with a reaction time of 5 seconds according to an embodiment of the present invention.
Figure 3B:
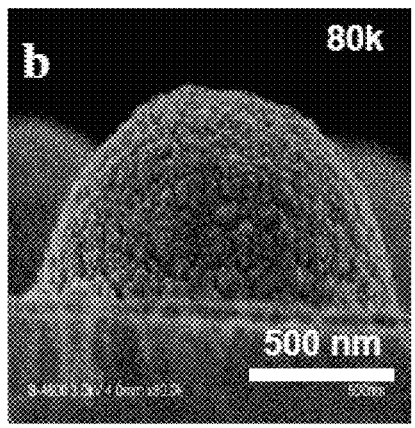
Figure 3C:
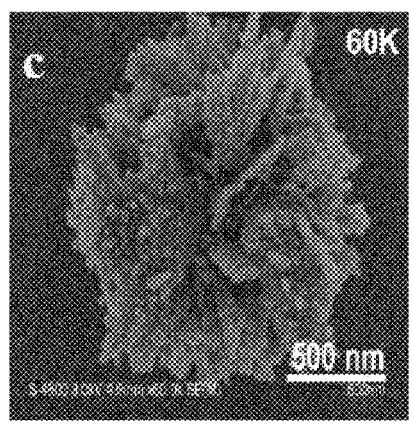
FIG. 3C and FIG. 3D are an SEM side view and an SEM front view of a silver nanostructure that is being formed by an electrochemical process with a reaction time of 10 seconds according to an embodiment of the present invention.
Figure 3D:
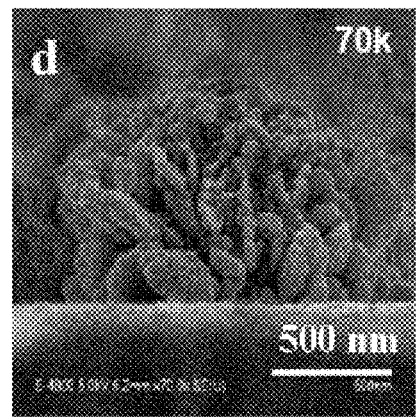
Figure 3E:
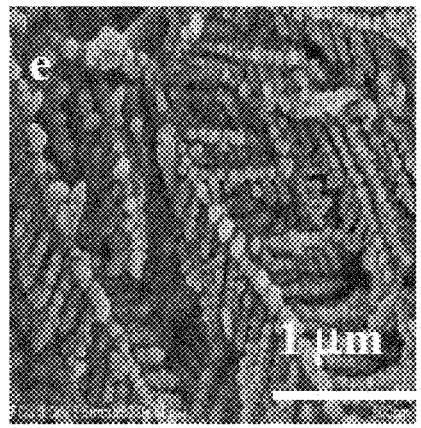
FIG. 3E and FIG. 3F are an SEM side view and an SEM front view of a silver nanostructure that is being formed by an electrochemical process with a reaction time of 20 seconds according to an embodiment of the present invention.
Figure 3F:
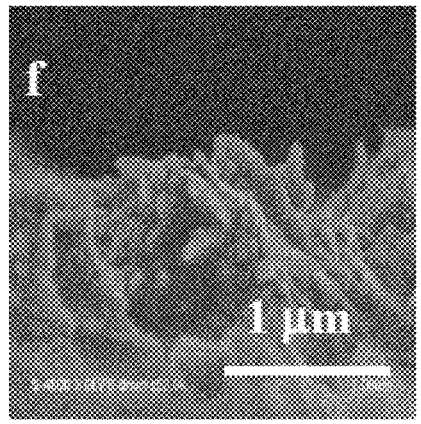

Please refer to FIG. 3A to FIG. 3F, which are SEM diagrams of silver nanostructures of the present invention, whereas the silver nanostructures are formed by the use of an electrochemical process in a solution containing 1.67 g silver nitride, 2.1 g citric acid and 50 ml deionized water, at constant operating voltage and under room temperature, but different reaction times. In detail, FIG. 3A and FIG. 3B are an SEM side view and an SEM front view of a silver nanostructure that is being formed by an electrochemical process with a reaction time of 5 seconds according to an embodiment of the present invention; FIG. 3C and FIG. 3D are an SEM side view and an SEM front view of a silver nanostructure that is being formed by an electrochemical process with a reaction time of 10 seconds according to an embodiment of the present invention; and FIG. 3E and FIG. 3F are an SEM side view and an SEM front view of a silver nanostructure that is being formed by an electrochemical process with a reaction time of 20 seconds according to an embodiment of the present invention. It is noted that flowing the increasing of reaction time, the silver nanostructure is growing from a ball with branches, into a shrub-like structure, and then further into a tree-like structure.

Figure 4A:
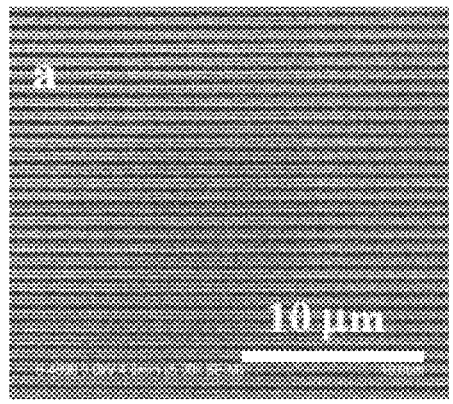
FIG. 4A is an SEM front view under a low magnification of a one-dimensional interfere pattern with a period of 600 nm that is formed using a laser interference lithography means.
Figure 4B:
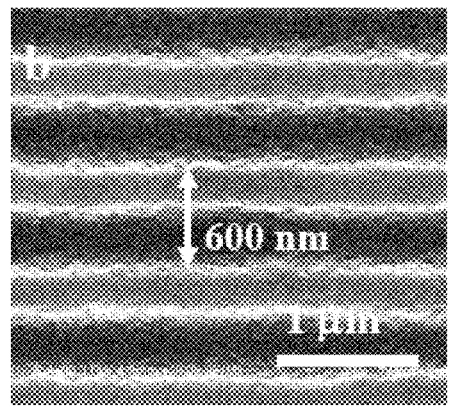
FIG. 4B is an SEM front view under a high magnification of a one-dimensional interfere pattern with a period of 600 nm that is formed using a laser interference lithography means.
Figure 4C:
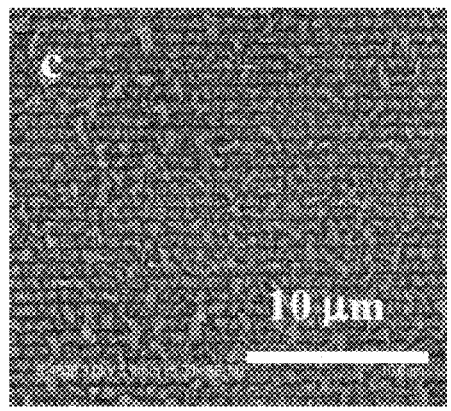
FIG. 4C is an SEM front view under a low magnification of a dendritic silver nanostructure with periodic pattern formed in the present invention.
Figure 4D:
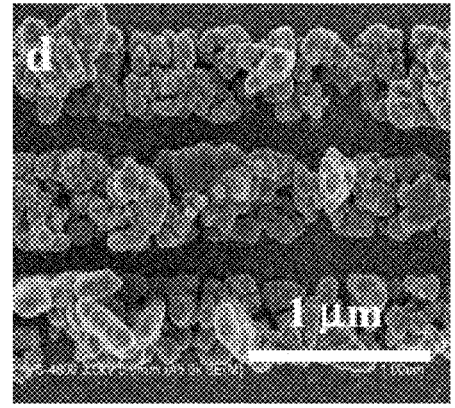
FIG. 4D is an SEM front view under a high magnification of a dendritic silver nanostructure with periodic pattern formed in the present invention.
Figure 5A:
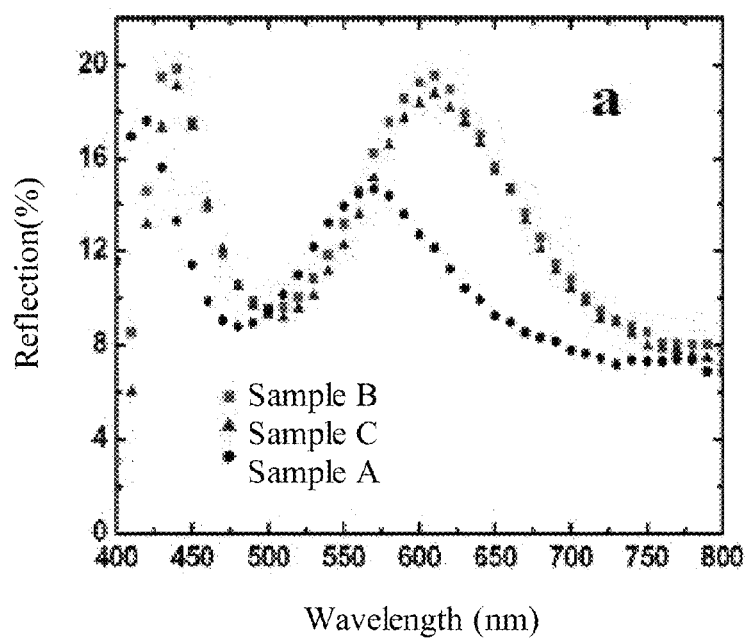
FIG. 5A is a diagram of reflection haze for layer without silver nanostructure and layers of different silver nanostructures with a period of 600 nm in response to an incident light with wavelength ranged between 400 nm~600 nm.

Please refer to FIG. 4A and FIG. 4B, which are respectively SEM front views under a low magnification and under a high magnification of a one-dimensional interfere pattern with a period of 600 nm that is formed using a laser interference lithography (LIL) means. The wavelength of the laser used in this embodiment is 445 nm, but is not limited thereby and can be adjusted according to actual requirement. Operationally, the pitch period can be induced and adjusted successfully by the LIL means, and moreover, by the rotation of the conductive substrate and multiple exposures, 2D interference patterns of different periods can be obtained. Please refer to FIG. 4C and FIG. 4D, which are respectively SEM front views under a low magnification and under a high magnification of an interfere pattern with a period of 600 nm that is formed using a laser interference lithography (LIL) means. In this embodiment, the specific pitch period of the pattern formed in the light trapping layer with the dendritic silver nanostructure with periods pattern is ranged between 50 nm to 10000 nm, while allowing the size of the dendritic silver nanostructure to be ranged between 100 nm to 5000 nm according to their different reaction times in the electrochemical process, Please refer to FIG. 5A, which is a diagram of reflection haze for layer without silver nanostructure and layers of different silver nanostructures with a period of 600 nm in response to an incident light with wavelength ranged between 400 nm~800 nm. In this embodiment, the sample A represents a conductive substrate without silver nanostructure growing thereon, the sample B represent a conductive substrate with silver nanostructure growing thereon by an electrochemical reaction time of 10 seconds, and the sample C represent a conductive substrate with silver nanostructure of 600 nm pitch period growing thereon by an electrochemical reaction time of 20 seconds that is further being deposited by an AZO transparent conductive layer of 100 nm. In the measurement of reflection haze in response to an incident light with wavelength ranged between 400 nm~800 nm that is shown in FIG. 5A, the sample C shows between reflection haze since comparatively it has larger roughness between the surface of the silver nanostructure and the AZO layer for causing more scattering to the incident light.

Figure 5B:
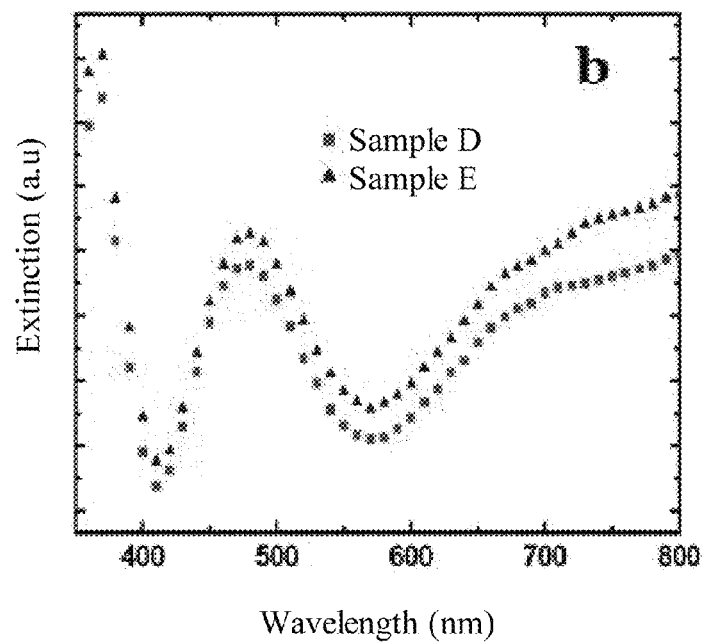
FIG. 5B is a diagram of extinction (a.u.) for layer without silver nanostructure and layers of different silver nanostructures with a period of 600 nm in response to an incident light with wavelength ranged between 400 nm~800 nm.

Please refer to FIG. 5B, which is a diagram of extinction (a.u.) for layer without silver nanostructure and layers of different silver nanostructures with a period of 600 nm in response to an incident light with wavelength ranged between 400 nm~800 nm. In this embodiment, the sample D represents a conductive substrate with silver nanostructure growing thereon by an electrochemical reaction time of 10 seconds, and the sample D represents a conductive substrate with silver nanostructure growing thereon by an electrochemical reaction time of 20 seconds. According to the principle of localized surface Plasmon polaritons (LSPR), when the distance between two neighboring silver nanoparticles is smaller than the average diameter of the silver nanoparticle and thus the coupling of two neighboring silver nanoparticles is enabled, the absorption peak in LSPR is moved toward the incident light with larger wavelength. However, the peak of the present invention is ranged between 370 nm and 480 nm, as the distance between two neighboring silver nanoparticles is larger than the average diameter of the silver nanoparticle.

Figures 6A, 6B:
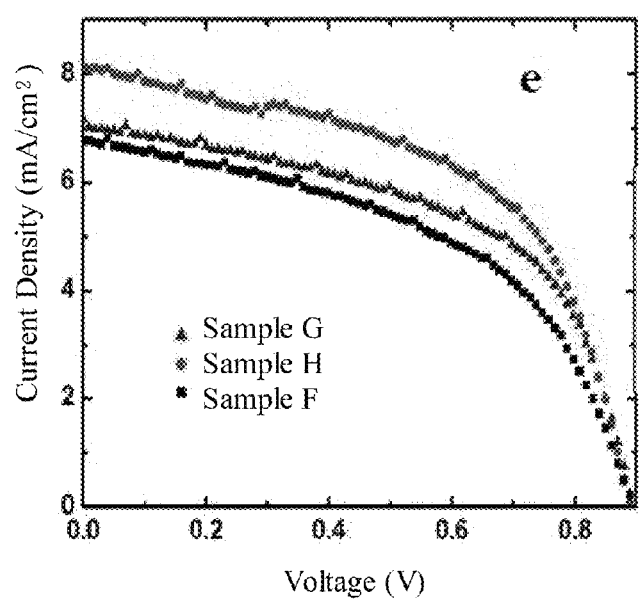
FIG. 6A is an I-V characteristic curve diagram for thin film solar cells without silver nanostructure and thin film solar cells of different silver nanostructures with a period of 600 nm.
FIG. 6B is a performance diagram showing the comparison between thin film solar cells whose back reflectors are formed with and without silver nanostructures.

Please refer to FIG. 6A and FIG. 6B, which are respectively an I-V characteristic curve diagram for thin film solar cells without silver nanostructure and thin film solar cells of different silver nanostructures with a period of 600 nm, and a performance diagram showing the comparison between thin film solar cells whose back reflectors are formed with and without silver nanostructures. In this embodiment, the sample F represents a conductive substrate without silver nanostructure growing thereon, the sample G represent a conductive substrate with silver nanostructure growing thereon by an electrochemical reaction time of 10 seconds, and the sample H represent a conductive substrate with silver nanostructure of 600 nm pitch period growing thereon by an electrochemical reaction time of 20 seconds that is further being deposited sequentially by a photoelectric conversion layer containing at least one p-i-n semiconductor structure of 350 nm in thickness (i.e. p-layer: 25 nm/i-layer: 300 nm/n-layer: 25 nm), an AZO transparent conducting layer of 100 nm in thickness, and an electrode layer, r so as to form a thin-film solar cell of 2×2 cm$^2$, but is not limited thereby. The measurement of I-V characteristic curve is performed respectively under A.M 1.5 spectrum, resulting that the measured open-circuit voltage ($V_{oc}$) is about 900 mV, the short-circuit current density ($J_{sc}$) is increased by 14% from 6.9 to 8.0 mA/cm$^2$, and the overall conversion efficiency is increased by 20% from 3.26% to 3.91%.

To sum up, by the aforesaid method for forming dendritic silver with periodic structure as light-trapping layer, the light-trapping layer is used as a back reflector of a solar cell and it is formed by the use of a laser interference lithography (LIL) process and an electrochemical process for enabling different dendritic silver nanostructures with different periodic patterns to be formed on a conductive layer of the solar cell while having a layer of Al-doped ZnO (AZO) of specific thickness to be covered thereon. Consequently, the thin film solar cell that is fabricated by the aforesaid method has the following characteristics:

(1) By the use of a laser interference lithography (LIL) process and an electrochemical process and the adjustment of the included angle formed between two incident laser beams that is matched with the laser wavelength, different dendritic silver nanostructures with different periodic patterns can be easily formed.

(2) With the size reduction of the silver particles, the influence of photoelectromagnetic effects, which include the effect of surface enhanced Raman scattering (SERS), the effect of surface plasmon resonance (SPR), and light confining/scattering effect, upon nano-scaled metal particles are enhanced, so that the conversion efficiency of the so-fabricated solar cells is increased.

(3) By the integration of the laser interference lithography (LIL) process, dendritic silver nanostructures and surface plasmon resonance (SPR) effect, it is possible to fabricated silver nanostructure of a specific period rapidly on the conductive substrate that can further be applied in the fabrication of large-size thin film solar cells with improved conversion efficiency.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for forming dendritic silver with periodic structure as light-trapping layer, including the steps of:
    (a) coating a photoresist layer on a side surface of a conductive substrate;
    (b) using an interference lithography device to provide and project at least two coherent beams of specific shapes onto the conductive substrate for forming an exposure area of a specific interference pattern thereon, wherein the specific interference pattern is a one-dimensional interference pattern;
    (c) adjusting and moving the at least two coherent beams to project upon another exposure area of the conductive substrate;
    (d) repeating steps (b) to (c) for a plurality of times for forming a plurality of exposure areas of the specific interference pattern that are interconnected to one another into a pattern of a specific pitch period;
    (e) performing an exposure lithography process;
    (f) placing the conductive substrate and a conductor separately inside a container containing an electrolyte while connecting the conductive substrate and the conductor respectively to a cathode and an anode of a direct-current source for enabling an electrochemical reaction to grow a dendritic silver nano structure, wherein the electrolyte is a solution at least containing silver nitride, citric acid and a solvent, and an operating voltage of the direct-current source for enabling the electrochemical reaction is at least 2V, while a reaction time of the electrochemical reaction is lasting for at least 10 seconds; and
    (g) performing an etching process upon the conductive substrate for removing any residue photoresist layer to form the dendritic silver nano structure with periodic patterns that is to be used as a light trapping layer.

2. The method of claim 1, wherein the exposure lithography process is enabled by an interference lithography device of Mach-Zehnder architecture; and the at least two coherent beams of specific shapes are coherent beams of uniform intensity and with a wavelength of 445 nm.

3. The method of claim 1, wherein the at least two coherent beams are projected in directions allowing a specific included angle sandwiched there between, while allowing the specific included angle to be adjustable.

4. The method of claim 1, wherein the step (b) further includes a step of: rotating or moving the conductive substrate and correspondingly adjusting the specific included angle for forming a two-dimensional interference pattern in the exposure area.

5. The method of claim 1, wherein the specific pitch period of the pattern formed in the light trapping layer with the dendritic silver nano structure with periodic pattern is ranged between 50 nm to 10000 nm, while allowing the size of the dendritic silver nano structure to be ranged between 100 nm to 5000 nm.

6. The method of claim 1, wherein the dendritic silver nano structure is formed in a shaped selected from the group consisting of: a shrub-like formation and a branch-like formation.

7. The method of claim 1, further comprising a step (h) of:
    performing a deposition process upon the conductive substrate for forming sequentially an a-Si photoelectric conversion layer containing at least one p-i-n semiconductor structure, a transparent conducting layer and an electrode layer on the light trapping layer so as to form a thin-film solar cell of dendritic silver nano structure with periodic pattern.

8. The method of claim 1, wherein the conductive substrate is a substrate selected from the group consisting of: an ITO glass substrate, a silver-containing substrate and a stainless steel substrate.

9. The method of claim 1, wherein the conductor is a bar or a panel that is made of platinum.

10. The method of claim 1, wherein the electrolyte contains at least one solvent, and the at least one solvent is selected from the group consisting of: a deionized water and a distilled water.

11. The method of claim 1, wherein the proportion of the silver nitride and the citric acid is defined by a mole ratio selected from the group consisting of: 0.8~0.9:1, 0.9~1:1, 0.9~1:1, 1~1.1:1, and 1.1~1.2:1.

12. The method of claim 7, wherein the transparent conducting layer is made of a material selected from the group consisting of: AZO, ITO, and IGTO.

13. The method of claim 7, wherein the deposition process is a process selected from the group consisting of: a PVD process, a CVD process and the combination of the two.

* * * * *